United States Patent
Lan et al.

(10) Patent No.: US 10,249,705 B2
(45) Date of Patent: Apr. 2, 2019

(54) CAPACITOR ARRAY STRUCTURE

(71) Applicant: ALi Corporation, Hsinchu (TW)

(72) Inventors: Tzu-Wei Lan, Hsinchu (TW);
Wei-Hsien Fang, Hsinchu (TW);
Chih-Yu Chuang, Hsinchu (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 15/806,149

(22) Filed: Nov. 7, 2017

(65) Prior Publication Data

US 2018/0358427 A1 Dec. 13, 2018

(30) Foreign Application Priority Data

Jun. 12, 2017 (CN) .......................... 2017 1 0437255

(51) Int. Cl.
*H01L 49/02* (2006.01)
*H01L 27/01* (2006.01)

(52) U.S. Cl.
CPC .............. *H01L 28/86* (2013.01); *H01L 27/01* (2013.01)

(58) Field of Classification Search
CPC ......... H01L 28/40; H01L 28/86; H01L 28/87; H01L 28/88; H01L 28/90; H01L 28/91; H01L 28/92
See application file for complete search history.

(56) References Cited

U.S. PATENT DOCUMENTS

| 7,872,852 B2 * | 1/2011 | Liao ................... H01L 23/5223 361/303 |
| 2014/0049872 A1 | 2/2014 | Huang et al. |
| 2014/0145304 A1 | 5/2014 | Lin et al. |
| 2014/0181775 A1 | 6/2014 | Fang et al. |

FOREIGN PATENT DOCUMENTS

CN       102522403       6/2012

* cited by examiner

*Primary Examiner* — Sonya D. McCall-Shepard
(74) *Attorney, Agent, or Firm* — J.C. Patents

(57) ABSTRACT

A capacitor array structure which includes N capacitor units is provided. Each capacitor unit includes a first metal layer, a second metal layer, and a third metal layer to form an upper electrode and a lower electrode. The second metal layer is disposed between the first metal layer and the third metal layer, and includes a second patterned metal portion of the lower electrode and a first patterned metal portion of the upper electrode. disposed above. The second patterned metal portion of the lower electrode has an opening, and a side of the first patterned metal portion of the upper electrode is exposed in the opening, such that the side of the first patterned metal portion of the upper electrode is adjacent to the lower electrode of another capacitor unit.

14 Claims, 6 Drawing Sheets

CAPACITOR ARRAY STRUCTURE

CROSS-REFERENCE TO RELATED APPLICATION

This application claims the priority benefit of China application serial no. 201710437255.8, filed on Jun. 12, 2017. The entirety of the above-mentioned patent application is hereby incorporated by reference herein and made a part of this specification.

BACKGROUND OF THE INVENTION

Field of the Invention

The invention relates to a capacitor array structure and more particularly relates to a capacitor array structure capable of reducing a parasitic capacitance with respect to a substrate or a metal wire.

Description of Related Art

In today's semiconductor industry, capacitors are very important and basic components. Among them, the metal-oxide-metal (MOM) capacitor structure is a common capacitor structure, the basic design of which is to fill an insulating medium between the positive metal plate and the negative metal plate that serve as the two electrodes, such that the positive metal plate and the negative metal plate and the insulating medium therein can form a capacitor unit. According to the design of the capacitor structure, generally, the unit capacitance is enhanced by reducing the thickness of the insulating medium between the electrodes or increasing the electrode surface area.

Besides, when the capacitor structure with parasitic capacitance is implemented in a circuit, the parasitic capacitance generated by the metal plates will also affect the overall performance of the circuit. Therefore, how to reduce the parasitic capacitance that may cause interference is also an important factor in the design of the capacitor structure. As the demand for semiconductor miniaturization continues to grow, how to improve the capacitor structure under the existing manufacturing specification to reduce interference of the parasitic capacitance has become an important research topic. In particular, for a circuit architecture composed of a large number of capacitors, the parasitic capacitance has a direct impact on the overall performance of the circuit. For example, the architecture of SAR (Successive Approximation Register) ADC (Analog-to-Digital Converter) requires a capacitor array of a large number of capacitors, and for most capacitors in the capacitor array, one of the electrodes is connected with one another. Referring to FIG. 1, FIG. 1 is a simplified circuit diagram of the capacitor array for SAR ADC. The capacitor array circuit 10 includes a plurality of capacitors C1, C2, C3, . . . , and CN, and one of the ends of each of the capacitors C1, C2, C3, . . . , and CN has a common potential. In other words, if the capacitors C1, C2, C3, . . . , and CN have the MOM capacitor structure, one of the metal electrodes of each of the capacitors C1, C2, C3, . . . , and CN may be connected with one another and have a common potential. Thus, if the metal electrode of the common potential generates a parasitic capacitance with the other objects around (e.g., substrate or metal wire), the overall circuit performance of the SAR ADC will be affected significantly.

SUMMARY OF THE INVENTION

In view of the above, the invention provides a capacitor array structure capable of reducing a parasitic capacitance generated by an upper electrode of a capacitor unit to reduce interference.

The invention provides a capacitor array structure, which includes N capacitor units. Each of the capacitor units includes an upper electrode and a lower electrode, wherein the capacitor units are arranged adjacent to one another along a first axial direction to form a capacitor series. An $i^{th}$ capacitor unit of the capacitor units includes a first metal layer, a second metal layer, and a third metal layer. The first metal layer includes a first patterned metal portion of the lower electrode. The second metal layer is disposed above the first metal layer, and the second metal layer includes a second patterned metal portion of the lower electrode and a first patterned metal portion of the upper electrode. The third metal layer is disposed above the second metal layer, and the third metal layer includes a third patterned metal portion of the lower electrode, a fourth patterned metal portion of the lower electrode, and a second patterned metal portion of the upper electrode. Herein, i is a positive integer not larger than N and N is a positive integer. The second patterned metal portion of the lower electrode has an opening, and a side of the first patterned metal portion of the upper electrode is exposed in the opening, such that the side of the first patterned metal portion of the upper electrode is adjacent to the lower electrode of an $(i-1)^{th}$ capacitor unit.

Based on the above, in the capacitor array structure of the invention, the parasitic capacitance effect caused by the upper electrode of each of the capacitor units may be reduced significantly. Therefore, the capacitor array structure of the invention is suitable to be applied to a circuit that is sensitive to the parasitic capacitance. Furthermore, the capacitor structures of the invention may be connected with one another through the connection portions that extend in the horizontal direction and the vertical direction, which makes it possible to flexibly lay out the capacitor array into any shape.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Reference will now be made in detail to the embodiments of the invention, examples of which are illustrated in the accompanying figures. Nevertheless, the invention may be embodied in many different forms and should not be construed as being limited to the embodiments set forth hereinafter. In the figures, for clarity, the sizes of the layers and elements and their relative sizes may not be drawn to scale.

Figure 1:
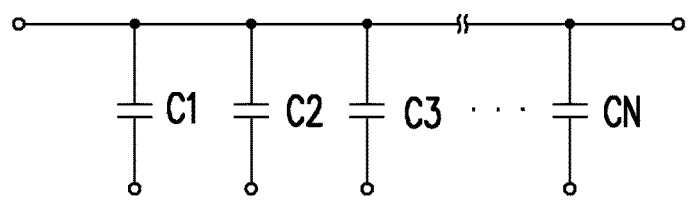
FIG. 1 is a simplified circuit diagram of the capacitor array for SAR ADC.
Figure 2:
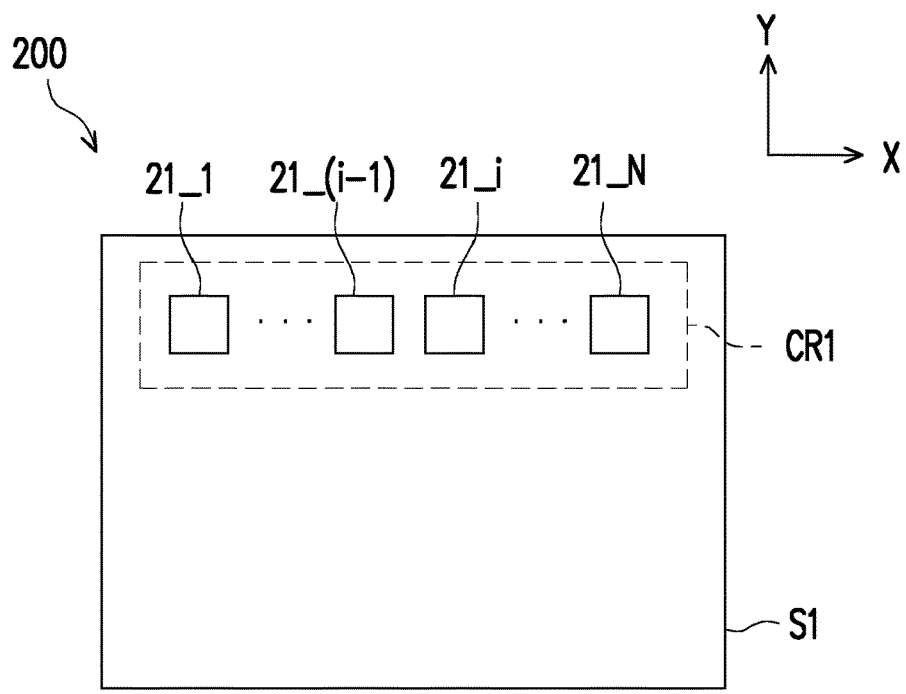
FIG. 2 is a schematic diagram of the capacitor array structure according to an embodiment of the invention.

FIG. 2 is a schematic diagram of a capacitor array structure according to an embodiment of the invention. Referring to FIG. 2, a capacitor array structure 200 includes N capacitor units 21_1 to 21_N (N is a positive integer), and the capacitor units 21_1 to 21_N are arranged adjacent to one another along a first axial direction (X axis) to form a capacitor series CR1. Each of the capacitor units 21_1 to 21_N is a metal-oxide-metal capacitor (MOM capacitor) and is disposed above a substrate S1. Each of the capacitor units 21_1 to 21_N includes an upper electrode and a lower electrode. It should be noted that, in this exemplary embodiment, the upper electrode of each of the capacitor units 21_1 to 21_N is surrounded by the lower electrode thereof and the lower electrodes of the adjacent capacitor units, so as to prevent the upper electrodes of the capacitor units 21_1 to 21_N and the substrate S1 or the wiring above the substrate S1 from forming a parasitic capacitance. Moreover, the capacitance of each of the capacitor units 21_1 to 21_N is not only provided by capacitance effect between the upper electrode and the lower electrode thereof, the capacitance of each of the capacitor units 21_1 to 21_N may also be provided by capacitance effect between the lower electrode thereof and the upper electrodes of the adjacent capacitor units. In this exemplary embodiment, the capacitor units 21_1 to 21_N have substantially the same structure and form capacitors by the same principle. Thus, an $i^{th}$ capacitor unit 21_i (i is a positive integer not larger than N) is described hereinafter as an example.

Figure 3A:
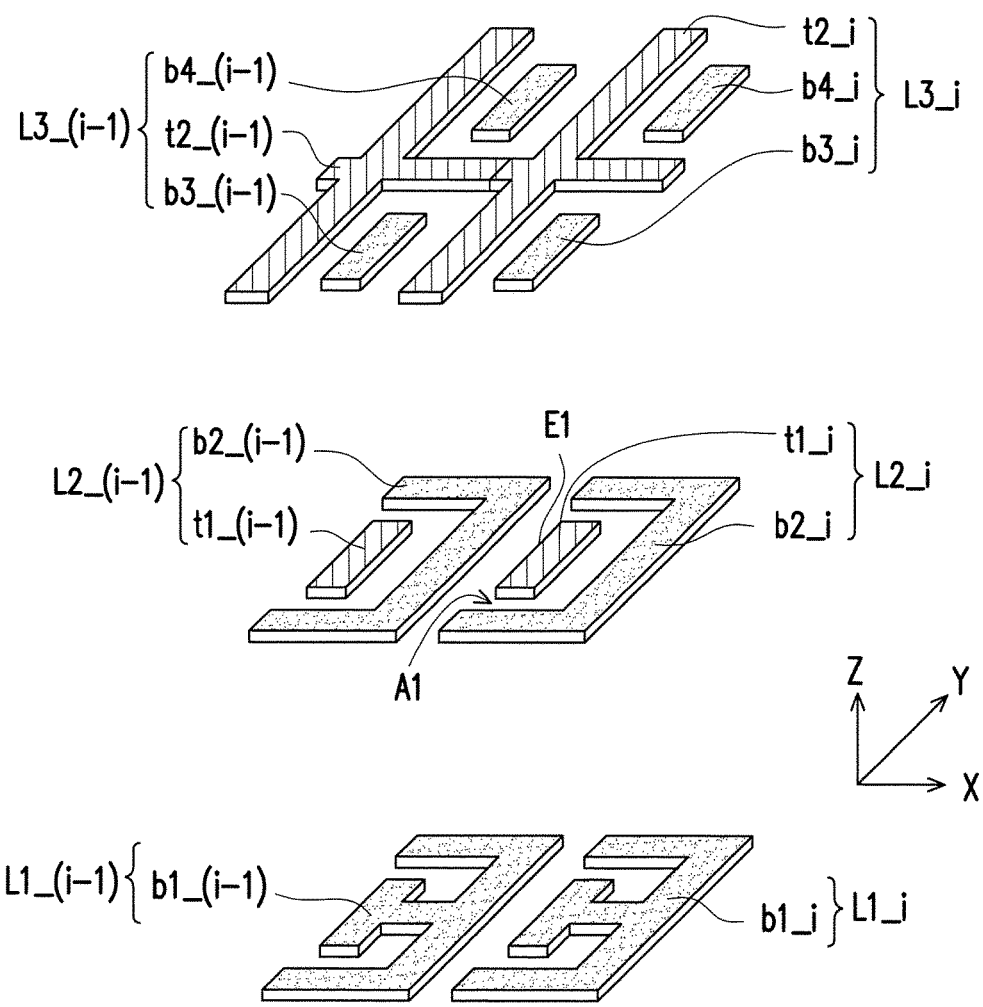
FIG. 3A is a schematic perspective view of the capacitor unit according to an embodiment of the invention.

FIG. 3A is a schematic perspective view of the capacitor unit according to an embodiment of the invention. Referring to FIG. 3A, the $i^{th}$ capacitor unit 21_i includes a first metal layer L_i, a second metal layer L2_i, and a third metal layer L3_i. The first metal layer L_i, the second metal layer L2_i, and the third metal layer L3_i form the upper electrode and the lower electrode of the capacitor unit 21_i (the upper electrode and the lower electrode are hatched differently). The upper electrode and the lower electrode are electrodes that have different polarities in the capacitor unit 21_i. For example, the upper electrode and the lower electrode may be positive and negative electrodes respectively.

The first metal layer L1_i, the second metal layer L2_i, and the third metal layer L3_i are stacked in parallel to one another sequentially along a second axial direction (Z axis) above the substrate S1. The second axial direction (Z axis) is perpendicular to a plane (XY plane) where the substrate S1 is located. The first metal layer L1_i and the second metal layer L2_i may be separated by a dielectric material. The second metal layer L2_i and the third metal layer L3_i may be separated by the dielectric material. The dielectric material is a material with high dielectric constant characteristics, such as $SiO_2$ or $Al_2O_3$, for example.

The first metal layer L1_i includes the first patterned metal portion b1_i of the lower electrode. The second metal layer L2_i is disposed above the first metal layer L1_i, and the second metal layer L2_i includes the second patterned metal portion b2_i of the lower electrode and the first patterned metal portion t1_i of the upper electrode. The third metal layer L3_i is disposed above the second metal layer L2_i, and the third metal layer L3_i includes the third patterned metal portion b3_i of the lower electrode, the fourth patterned metal portion b4_i of the lower electrode, and the second patterned metal portion t2_i of the upper electrode. Although FIG. 3A does not illustrate connection vias, the first patterned metal portion t1_i and the second patterned metal portion t2_i that form the upper electrode may be electrically connected with each other through the vias. In addition, the first patterned metal portion b1_i, the second patterned metal portion b2_i, the third patterned metal portion b3_i, and the fourth patterned metal portion b4_i that form the lower electrode may also be connected with one another through the vias.

In this exemplary embodiment, the $(i-1)^{th}$ capacitor unit 21_(i-1) is disposed beside the $i^{th}$ capacitor unit 21_i and has the same structure as the $i^{th}$ capacitor unit 21_i. In other words, the $(i-1)^{th}$ capacitor unit 21_(i-1) also includes a first metal layer L1_(i-1), a second metal layer L2_(i-1), and a third metal layer L3_(i-1). The first metal layer L1_(i-1), the second metal layer L2_(i-1), and the third metal layer L3_(i-1) form the upper electrode and the lower electrode of the capacitor unit 21_(i-1) (the upper electrode and the lower electrode are hatched differently). The first metal layer L1_(i-1), the second metal layer L2_(i-1), and the third metal layer L3_(i-1) are stacked in parallel to one another sequentially along the second axial direction (Z axis) above the substrate S1.

In the $(i-1)^{th}$ capacitor unit 21_(i-1), the first metal layer L1_(i-1) includes the first patterned metal portion b1_(i-1) of the lower electrode. The second metal layer L2_(i-1) is disposed above the first metal layer L1_(i-1), and the second metal layer L2_(i-1) includes the second patterned metal portion b2_(i-1) of the lower electrode and the first patterned metal portion t1_(i-1) of the upper electrode. The third metal layer L3_(i-1) is disposed above the second metal layer L2_(i-1), and the third metal layer L3_(i-1) includes the third patterned metal portion b3_(i-1) of the lower electrode, the fourth patterned metal portion b4_(i-1) of the lower electrode, and the second patterned metal portion t1_(i-1) of the upper electrode.

In this exemplary embodiment, the second patterned metal portion b2_i of the lower electrode of the $i^{th}$ capacitor unit 21_i has an opening A1, and a side E1 of the first patterned metal portion t1_i of the upper electrode is exposed in the opening A1, such that the side E1 of the first patterned metal portion t1_i of the upper electrode is adjacent to the lower electrode of the $(i-1)^{th}$ capacitor unit 21_(i-1). More specifically, the second metal layer L2_i of the $i^{th}$ capacitor unit 21_i is disposed beside and adjacent to the second meal layer L2_(i-1) of the $i^{th}$ capacitor unit 21_(i-1), and the first patterned metal portion t1_i of the upper electrode of the $i^{th}$ capacitor unit 21_i is adjacent to the second patterned metal portion b1_(i-1) of the lower electrode of the $(i-1)^{th}$ capacitor unit 21_(i-1). Thus, besides the capacitor formed between the lower electrode and the upper electrode of the $i^{th}$ capacitor unit 21_i, the first patterned metal portion t1_i of the upper electrode of the $i^{th}$ capacitor unit 21_i and the second patterned metal portion b1_(i-1) of the lower electrode of the $(i-1)^{th}$ capacitor unit 21_(i-1) also form a capacitor therebetween.

In this exemplary embodiment, the second patterned metal portion t2_i of the upper electrode of the $i^{th}$ capacitor unit 21_i is disposed adjacent to a side of the third patterned metal portion b3_i of the lower electrode. Moreover, the second patterned metal portion t2_i of the upper electrode of the $i^{th}$ capacitor unit 21_i is disposed adjacent to a side of the fourth patterned metal portion b4_i of the lower electrode. Accordingly, the second patterned metal portion t2_i of the upper electrode of the $i^{th}$ capacitor unit 21_i is adjacent to the lower electrode of the $(i-1)^{th}$ capacitor unit 21_(i-1). More specifically, the third metal layer L3_i of the $i^{th}$ capacitor unit 21_i is disposed beside and adjacent to the third metal layer L3_(i−1) of the (i−1)$^{th}$ capacitor unit 21_(i−1), and the second patterned metal portion t2_i of the upper electrode of the i$^{th}$ capacitor unit 21_i is adjacent to the third patterned metal portion b3_(i−1) and the fourth patterned metal portion b4_(i−1) of the lower electrode of the (i−1)$^{th}$ capacitor unit 21_(i−1). Accordingly, the second patterned metal portion t2_i of the upper electrode of the capacitor unit 21_i and the third patterned metal portion b3_(i−1) and the fourth patterned metal portion b4_(i−1) of the lower electrode of the (i−1)$^{th}$ capacitor unit 21_(i−1) may also form a capacitor therebetween.

In addition, although not shown in FIG. 3A, it is known from the above description that a (i+1)$^{th}$ capacitor unit 21_(i+1) is disposed beside the i$^{th}$ capacitor unit 21_i, and the (i+1)$^{th}$ capacitor unit 21_(i+1) has the same structure as the i$^{th}$ capacitor unit 21_i. Therefore, the upper electrode of the (i+1)$^{th}$ capacitor unit 21_(i+1) and the lower electrode of the i$^{th}$ capacitor unit 21_i may also form a capacitor therebetween.

Figure 3B:
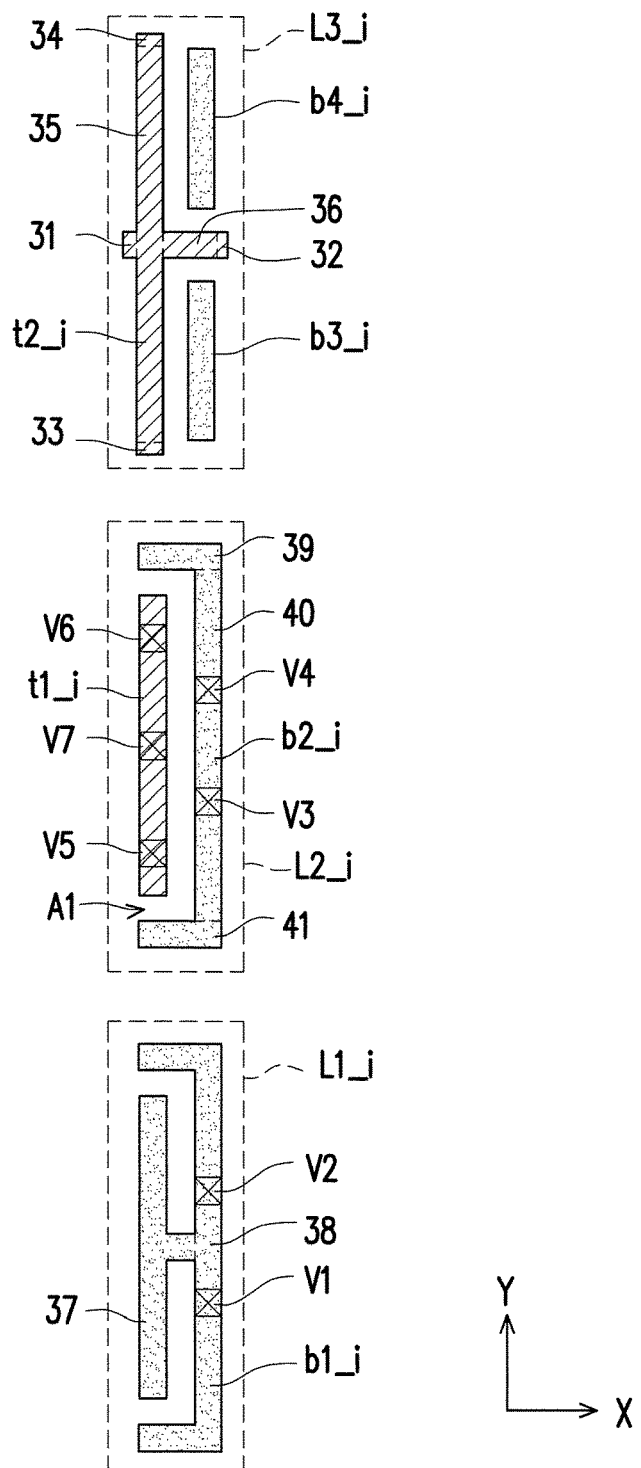
FIG. 3B is a schematic top view of the first metal layer, the second metal layer, and the third metal layer according to the embodiment of FIG. 3A.

FIG. 3B is a schematic top view of the first metal layer, the second metal layer, and the third metal layer according to the embodiment of FIG. 3A. Referring to FIG. 3B, the second patterned metal portion t2_i of the upper electrode includes a long linear portion 35, a short linear portion 36, and a plurality of connection portions 31, 32, 33, and 34. The long linear portion 35 is perpendicular to the short linear portion 36, and the short linear portion 36 and the long linear portion 35 intersect at an intersection point between two ends of the long linear portion 35. The connection portion 31 is located beside the intersection point of the short linear portion 36 and the long linear portion 35. The connection portions 33 and 34 are respectively located on the two ends of the long linear portion, and the connection portion 32 is located on an end of the short linear portion 36. Thus, the capacitor unit 21_i may be connected with other capacitor units in different directions through the connection portions 31, 32, 33, and 34 that protrude outward. Referring to both the exemplary embodiments of FIG. 3A and FIG. 3B, the second patterned metal portion t2_i of the i$^{th}$ capacitor unit 21_i may be connected with the second patterned metal portion t2_(i−1) of the (i−1)$^{th}$ capacitor unit 21_(i−1) through the connection portion 31. Accordingly, during circuit operation, the upper electrode of the i$^{th}$ capacitor unit 21_i and the upper electrode of the (i−1)$^{th}$ capacitor unit 21_(i−1) have a common potential.

Then, referring to FIG. 3B, the third patterned metal portion b3_i of the lower electrode has the same top view pattern as the fourth patterned metal portion b4_i of the lower electrode, and the third patterned metal portion b3_i of the lower electrode and the fourth patterned metal portion b4_i of the lower electrode are located on two different sides of the short linear portion 36 of the second patterned metal portion t2_i of the upper electrode. Moreover, the second patterned metal portion t2_i of the upper electrode is disposed adjacent to a side of the third patterned metal portion b3_i of the lower electrode, and the second patterned metal portion t2_i of the upper electrode is disposed adjacent to a side of the fourth patterned metal portion b4_i of the lower electrode. In other words, the long linear portion 35 of the second patterned metal portion t2_i of the upper electrode and the third patterned metal portion b3_i of the lower electrode and the fourth patterned metal portion b4_i of the lower electrode are arranged side by side. Accordingly, referring to the exemplary embodiments of FIG. 3A and FIG. 3B, a side of the long linear portion 35 of the second patterned metal portion t2_i of the upper electrode is adjacent to the lower electrode of the (i−1)$^{th}$ capacitor unit 21_(i−1).

Further, referring to FIG. 3B again, the second patterned metal portion b2_i of the lower electrode includes a first linear portion 39, a second linear portion 40, and a third linear portion 41, and the first linear portion 39 and the third linear portion 41 are arranged in parallel to each other. The first linear portion 39 and the third linear portion 41 are respectively connected with two ends of the second linear portion 40, and the opening A1 is formed between the first linear portion 39 and the third linear portion 41. The first metal portion t1_i of the upper electrode has an elongated shape and is located between the first linear portion 39 and the third linear portion 41. Accordingly, referring to both the exemplary embodiments of FIG. 3A and FIG. 3B, a side E1 of the second patterned metal portion t1_i of the upper electrode is adjacent to the lower electrode of the (i−1)$^{th}$ capacitor unit 21_(i−1). In addition, the first patterned metal portion b1_i of the lower electrode includes a T-shaped portion 37 and a U-shaped portion 38. A leg portion of the T-shaped portion 37 extends into the U-shaped portion 38 to perpendicularly intersect a bottom portion of the U-shaped portion 38, and a head portion of the T-shaped portion 37 is located in the U-shaped portion 38.

In this exemplary embodiment, the first patterned metal portion b1_i of the lower electrode, the second patterned metal portion b2_i of the lower electrode, the third patterned metal portion b3_i of the lower electrode, and the fourth patterned metal portion b4_i of the lower electrode are electrically connected with one another through a plurality of first connection vias V1, V2, V3, and V4. The first patterned metal portion t1_i of the upper electrode and the second patterned metal portion t2_i of the upper electrode are electrically connected with each other through a plurality of second connection vias V5, V6, and V7. Based on the above configuration, the first patterned metal portion t1_i of the upper electrode is held between the first patterned metal portion b1_i of the lower electrode and the long linear portion 35 of the second patterned metal portion t2_i of the upper electrode.

In the embodiments of FIG. 3A and FIG. 3B, the capacitor unit includes three metal layers, for example. However, the invention is not limited thereto. Considering enhancement of the capacitance, multiple metal layers that have the same shape as the second metal layer may be repeatedly disposed between the first metal layer and the third metal layer. An embodiment is described hereinafter as an example.

Figure 4:
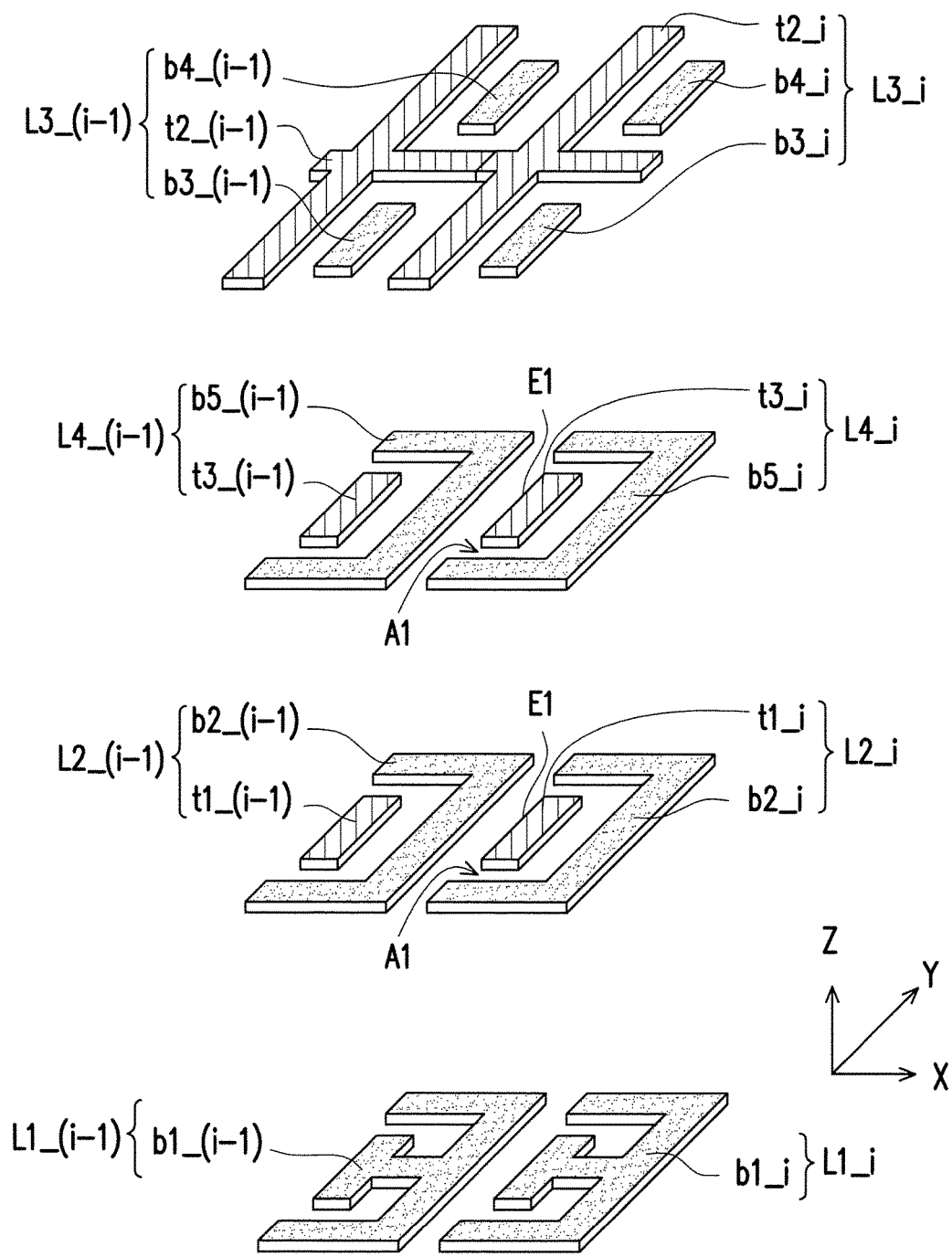
FIG. 4 is a schematic perspective view of the capacitor unit according to an embodiment of the invention.

FIG. 4 is a schematic perspective view of the capacitor unit according to an embodiment of the invention. Referring to FIG. 4, in addition to the first metal layer L1_i, the second metal layer L2_i, and the third metal layer L3_i, the i$^{th}$ capacitor unit 21_i further includes a fourth metal layer L4_i. The fourth metal layer L4_i is disposed between the second metal layer L2_i and the third metal layer L3_i, and the fourth metal layer L4_i includes the third patterned metal portion t3_i of the upper electrode and the fifth patterned metal portion b5_i of the lower electrode. The third patterned metal portion t3_i of the upper electrode has the same top view pattern as the first patterned metal portion t1_i of the upper electrode, and the fifth patterned metal portion b5_i of the lower electrode has the same top view pattern as the second patterned metal portion b2_i of the lower electrode. The third patterned metal portion t3_i of the upper electrode is also connected with other portions of the upper electrode (i.e., the first patterned metal portion t1_i of the upper electrode and the second patterned metal portion t2_i of the upper electrode) through the vias, and the fifth patterned metal portion b5_i of the lower electrode is also connected with other portions of the lower electrode (i.e., the second patterned metal portion b2_i of the lower electrode, the third patterned metal portion b3_i of the lower electrode, and the fourth patterned metal portion b4_i of the lower electrode) through the vias.

Figure 5:
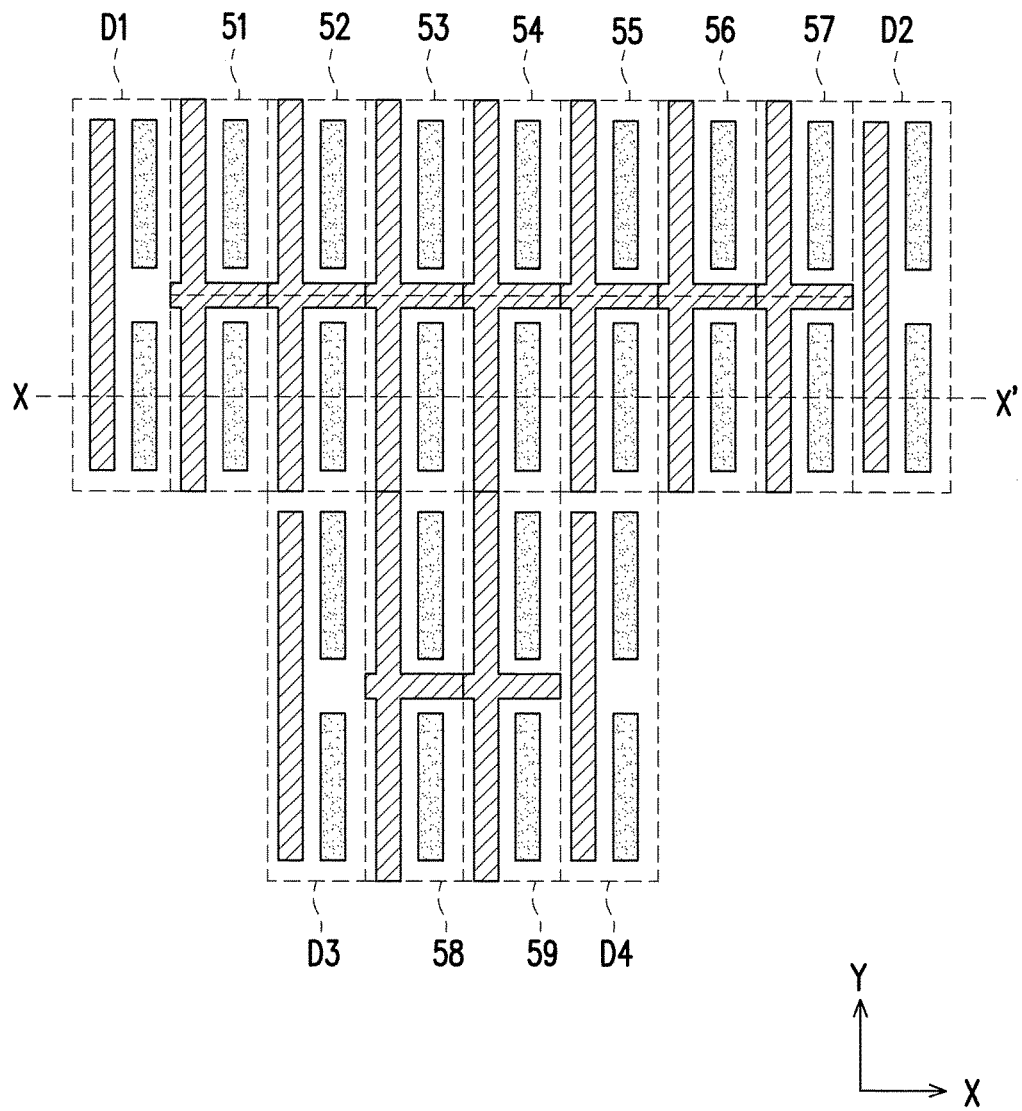
FIG. 5 is a top view of the capacitor array structure according to the embodiment of FIG. 4.

FIG. 5 is a top view of the capacitor array structure according to the embodiment of FIG. 4. Referring to FIG. 5, a capacitor array structure 500 includes a plurality of capacitor units as shown in FIG. 4 that are arranged in an array. More specifically, the capacitor units may be connected with one another through the connection portions of the upper electrode, so as to form the array arrangement. Moreover, a plurality of dummy capacitor units may be disposed around the array of the capacitor array structure 500 to surround the capacitor array structure. For example, seven capacitor units 51, 52, 53, 54, 55, 56, and 57 may be arranged along the X axis to form a capacitor series, and dummy capacitor units D1 and D2 are respectively disposed at two ends of the capacitor series formed of the capacitor units 51 to 57. In addition, two capacitor units 58 and 59 may also be arranged along the X axis to form another capacitor series, and dummy capacitor units D3 and D4 are respectively disposed at two ends of the capacitor series formed of the capacitor units 58 and 59. The upper electrode of the capacitor unit 58 is electrically connected with the upper electrode of the capacitor unit 53 in the Y direction, and the upper electrode of the capacitor unit 59 is electrically connected with the upper electrode of the capacitor unit 54 in the Y direction. In the exemplary embodiment of FIG. 5, the upper electrodes of the capacitor units 51 to 57 that form the capacitor series are electrically connected with one another along the X direction, and the upper electrodes of the capacitor units 58 to 59 that form the capacitor series are electrically connected with each other along the X direction. Moreover, the upper electrode of the capacitor unit 58 is electrically connected with the upper electrode of the capacitor unit 53, and the upper electrode of the capacitor unit 59 is electrically connected with the upper electrode of the capacitor unit 54. It should be noted that, as shown in the exemplary embodiment of FIG. 5, the upper electrodes of the dummy capacitor units D1 and D2 are not respectively electrically connected with the upper electrodes of the capacitor units 51 and 57, and the upper electrodes of the dummy capacitor units D3 and D4 are not respectively electrically connected with the upper electrodes of the capacitor units 58 and 59. To sum up, the capacitor array structure 500 of the invention may be arranged flexibly to form a capacitor array in any shape through the connection portions of the capacitor units. Nevertheless, the arrangement of FIG. 5 is merely an example, and the number and arrangement of the capacitor units may be designed according to the actual application.

It is known from the descriptions of FIG. 2 to FIG. 4 that, through the array arrangement and shape configuration of the capacitor units of the invention, the bottom portion and four sides of the upper electrode of each of the capacitor units are surrounded by the lower electrode thereof and the lower electrodes of the adjacent capacitor units, so as to reduce the parasitic capacitance formed by the upper electrode of each of the capacitor units and other objects around (e.g., the substrate or metal wire). In addition, the lower electrode of each of the capacitor units not only forms a capacitor with the upper electrode thereof to provide a capacitance but also forms a capacitor with the upper electrodes of the adjacent capacitor units to provide a capacitance.

Figure 6:
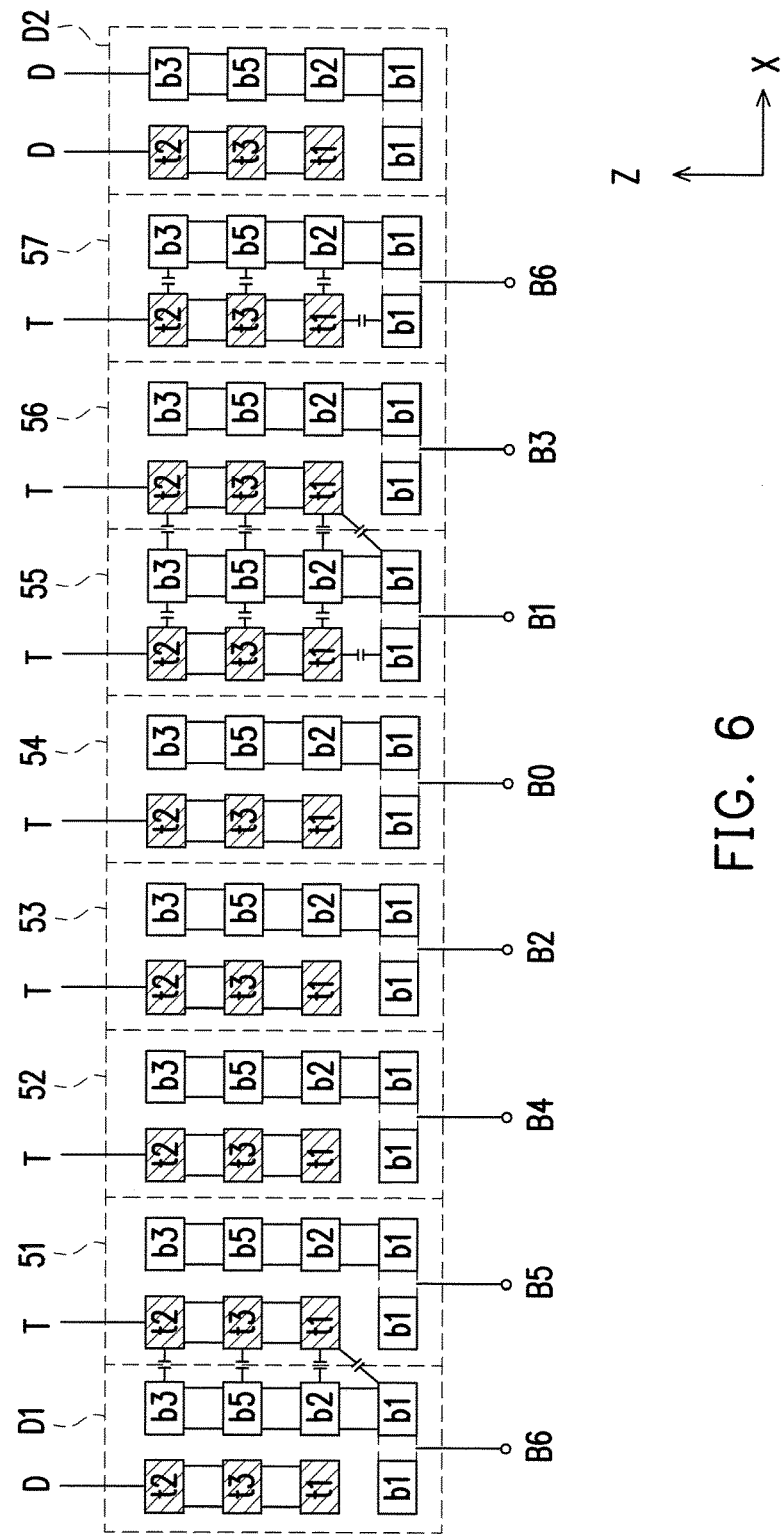
FIG. 6 is a cross-sectional view of the capacitor array structure according to the embodiment of FIG. 5.

More specifically, FIG. 6 is a cross-sectional view of the capacitor array structure according to the embodiment of FIG. 5. Referring to FIG. 6, FIG. 6 is a cross-sectional view of the capacitor array structure of FIG. 5 along the X-X' line. The capacitor units 51, 52, 53, 54, 55, 56, and 57 are arranged sequentially along the X direction to form a capacitor series, and the dummy capacitor units D1 and D2 are respectively arranged at two ends of the capacitor series. The upper electrodes of the capacitor units 51, 52, 53, 54, 55, 56, and 57 may be connected with an end T to be coupled to the same first operating voltage, and the lower electrodes of the capacitor units 51, 52, 53, 54, 55, and 56 may be sequentially connected with an end B5, an end B4, an end B2, an end B0, an end B1, and an end B3 respectively. It should be noted that the lower electrode of the capacitor unit 57 and the lower electrode of the dummy capacitor unit D1 are connected with the same end B6. The upper electrode of the dummy capacitor unit D1 is connected with an end D to be coupled to a predetermined reference voltage. The upper electrode and the lower electrode of the dummy capacitor unit D2 are both connected with the end D to be coupled to the predetermined reference voltage.

In this embodiment, the capacitor units 51, 52, 53, 54, 55, 56, and 57 may provide the same unit capacitance, and may provide a multiple of the unit capacitance if the lower electrodes of the capacitor units are connected through the metal wire under the first metal layer. For example, if the end B2 of the capacitor unit 53 is connected with the end B4 of the capacitor unit 52, the capacitor unit 53 and the capacitor unit 52 may be combined to serve as a capacitor element capable of providing twice the unit capacitance in the circuit. The capacitance that each capacitor unit may provide is described in detail hereinafter.

Referring to FIG. 6, the upper electrode of the capacitor unit 55 may form a capacitor with the lower electrode of the capacitor unit 55. As shown in the figure, the first patterned metal portion b1 of the lower electrode of the capacitor unit 55 and the first patterned metal portion t1 of the upper electrode of the capacitor unit 55 may form a capacitor therebetween, and the first patterned metal portion b1 of the lower electrode of the capacitor unit 55 and the other patterned metal portions (e.g., the patterned metal portions t2 and t3) of the upper electrode of the capacitor unit 55 may form a capacitor therebetween. In addition, the second patterned metal portion b2 of the lower electrode of the capacitor unit 55 and the first patterned metal portion t1 of the upper electrode of the capacitor unit 55 may form a capacitor therebetween, and the second patterned metal portion b2 of the capacitor unit 55 and the other patterned metal portions (e.g., the patterned metal portions t2 and t3) of the lower electrode of the capacitor unit 55 may form a capacitor therebetween. Furthermore, the third patterned metal portion b3 of the lower electrode of the capacitor unit 55 and the second patterned metal portion t2 of the upper electrode of the capacitor unit 55 may form a capacitor therebetween, and the third patterned metal portion b3 of the lower electrode of the capacitor unit 55 and the other patterned metal portions (e.g., the patterned metal portions t1 and t3) of the upper electrode of the capacitor unit 55 may form a capacitor therebetween. Moreover, the fifth patterned metal portion b5 of the lower electrode of the capacitor unit 55 and the third patterned metal portion t3 of the upper electrode of the capacitor unit 55 may form a capacitor therebetween, and the fifth patterned metal portion b5 of the lower electrode of the capacitor unit 55 and the other patterned metal portions (e.g., the patterned metal portions t1 and t2) of the upper electrode of the capacitor unit 55 may form a capacitor therebetween. In a word, the capacitor unit 55 may provide a capacitor by the upper electrode (e.g., the patterned metal portions b1, b2, b3, and b5) and the lower electrode (e.g., the patterned metal portions t1, t2, and t3) thereof. Here, the capacitance provided by the upper electrode and the lower electrode thereof is called an internal capacitance Ci.

In addition to the internal capacitance Ci described above, the lower electrode of the capacitor unit 55 and the upper electrode of the adjacent capacitor unit 56 may also form a capacitor therebetween, so as to provide the capacitance of the capacitor unit. For example, the first patterned metal portion b1 of the lower electrode of the capacitor unit 55 and the first patterned metal portion t1 of the upper electrode of the capacitor unit 56 may form a capacitor therebetween, and the first patterned metal portion b1 of the lower electrode of the capacitor unit 55 and the other patterned metal portions (e.g., the patterned metals t2 and t3) of the upper electrode of the capacitor unit 56 may form a capacitor therebetween. In addition, the second patterned metal portion b2 of the lower electrode of the capacitor unit 55 and the first patterned metal portion t1 of the upper electrode of the adjacent capacitor unit 56 may form a capacitor therebetween, and the second patterned metal portion b2 of the lower electrode of the capacitor unit 55 and the other patterned metal portions (e.g., the patterned metal portions t2 and t3) of the upper electrode of the capacitor unit 56 may form a capacitor therebetween. Moreover, the third patterned metal portion b3 of the lower electrode of the capacitor unit 55 and the second patterned metal portion t2 of the upper electrode of the capacitor unit 56 may form a capacitor therebetween, and the third patterned metal portion b3 of the lower electrode of the capacitor unit 55 and the other patterned metal portions (e.g., the patterned metal portions t1 and t3) of the upper electrode of the capacitor unit 56 may form a capacitor therebetween. Furthermore, the fifth patterned metal portion b5 of the lower electrode of the capacitor unit 55 and the third patterned metal portion t3 of the upper electrode of the capacitor unit 56 may form a capacitor therebetween, and the fifth patterned metal portion b5 of the lower electrode of the capacitor unit 55 and the other patterned metal portions (e.g., the patterned metal portions t1 and t2) of the upper electrode of the capacitor unit 56 may form a capacitor therebetween. In a word, the capacitor unit 55 may form a capacitor through the lower electrode thereof (e.g., the patterned metal portions b1, b2, b3, and b5) and the upper electrode (e.g., the patterned metal portions t1, t2, and t3) of the adjacent capacitor unit 56. Here, the capacitance provided by the capacitor formed by the lower electrode thereof and the upper electrode of the adjacent capacitor unit is called an external capacitance Ce. It should be noted that, according to the arrangement of this embodiment, the lower electrode of the capacitor unit 54 already separates the upper electrode of the capacitor unit 54 and the lower electrode of the capacitor unit 55. Therefore, the lower electrode of the capacitor unit 55 does not form a capacitor with the upper electrode of the capacitor unit 54.

The above describes the internal capacitance Ci and the external capacitance Ce provided by the capacitor unit 55. Thus, a capacitance C provided by the capacitor unit 55 is a sum of the internal capacitance and the external capacitance. That is, $C=Ci+Ce$. Likewise, the capacitor units 51, 52, 53, 54, and 56 may respectively provide the same capacitance C.

The internal capacitance Ci provided by the capacitor unit 57 is similar to that described above and thus is not repeated hereinafter. The following will describe in detail the external capacitance Ce that the capacitor unit 57 provides. The dummy capacitor unit D2 is disposed at the right side of the capacitor unit 57, and during the actual circuit operation, the upper electrode and the lower electrode of the dummy capacitor unit D2 are connected with the end D to be coupled to the predetermined reference voltage. Moreover, the upper electrode of the dummy capacitor unit D1 is connected with the end D to be coupled to the predetermined reference voltage, and the lower electrode of the dummy capacitor unit D1 is connected with the end B6 to be coupled to the same voltage as the lower electrode of the capacitor unit 57. Therefore, although the lower electrode of the capacitor unit 57 does not form a capacitor with the upper electrode of the dummy capacitor unit D2, the lower electrode of the capacitor unit 57 and the dummy capacitor unit D1 may be coupled to the same end B6 (which means that the lower electrode of the capacitor unit 57 and the lower electrode of the capacitor unit D1 have a common potential) for the lower electrode of the capacitor unit 57 to form a capacitor based on the lower electrode of the dummy capacitor unit D1 and the upper electrode of the capacitor unit 51 to generate the external capacitance Ce. In other words, the capacitor formed by the lower electrode of the dummy capacitor unit D1 and the upper electrode of the capacitor unit 51 may serve as the external capacitance of the capacitor unit 57. That is, the capacitance provided by the capacitor unit 57 is the same as those of the other capacitor units 51 to 56, which are all $C=Ci+Ce$.

To conclude the above, in the capacitor array structure of the invention, the lower electrode of one capacitor unit not only forms a capacitor with the upper electrode thereof but also forms a capacitor with the upper electrode of the adjacent capacitor unit. Besides, according to the capacitor array structure of the invention, the upper electrode of each capacitor unit is isolated by dummy capacitors and is less likely to form a parasitic capacitance with the substrate or other metal wires. Therefore, the metal-oxide-metal capacitor of the invention is suitable for a circuit that is sensitive to the parasitic capacitance. In other words, the capacitor array structure of the invention may reduce the interference of parasitic capacitance, and the capacitor units may provide uniform capacitances to ensure stable operation of the circuit. The lower electrode of the capacitor unit may form capacitors with both the upper electrode thereof and the upper electrode of the adjacent capacitor unit. Based on this, in the case where output of a certain capacitance is secured, the capacitor units of the invention occupy a smaller layout area. In addition, the capacitor structure of the invention may be connected with one another through the connection portions that extend in the horizontal direction and the vertical direction, which makes it possible to flexibly lay out the capacitor array into any shape. Furthermore, based on the geometrical structure of each metal layer of the invention, in the case where output of a certain capacitance is secured, the capacitor units may be arranged on the substrate at a high density.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A capacitor array structure, comprising:
   N capacitor units each comprising an upper electrode and a lower electrode, wherein the upper electrode and the lower electrode comprise a plurality of metal portions, and the metal portions are patterned, wherein the capacitor units are arranged adjacent to one another along a first axial direction to form a capacitor series, and an $i^{th}$ capacitor unit of the capacitor units comprises:

a first metal layer comprising a first metal portion of the lower electrode;

a second metal layer disposed above the first metal layer and comprising a second metal portion of the lower electrode and a first metal portion of the upper electrode; and a third metal layer disposed above the second metal layer and comprising a third metal portion of the lower electrode, a fourth metal portion of the lower electrode, and a second metal portion of the upper electrode, wherein i is a positive integer not larger than N and N is a positive integer, wherein i is larger than or equal to 2, wherein the second metal portion of the lower electrode has an opening, and a side of the first metal portion of the upper electrode is exposed in the opening, such that the side of the first metal portion of the upper electrode is adjacent to the lower electrode of an $(i-1)^{th}$ capacitor unit.

2. The capacitor array structure according to claim 1, wherein a long linear portion of the second metal portion of the upper electrode is arranged side by side with the third metal portion of the lower electrode and the fourth metal portion of the lower electrode, and a side of the long linear portion is adjacent to the lower electrode of the $(i-1)^{th}$ capacitor unit.

3. The capacitor array structure according to claim 1, wherein a second axial direction is perpendicular to a plane where a substrate is located, and the first metal layer, the second metal layer, and the third metal layer are stacked sequentially along the second axial direction above the substrate.

4. The capacitor array structure according to claim 1, wherein the first metal layer and the second metal layer are separated by a dielectric material, and the second metal layer and the third metal layer are separated by the dielectric material.

5. The capacitor array structure according to claim 1, wherein the first metal portion of the lower electrode, the second metal portion of the lower electrode, the third metal portion of the lower electrode, and the fourth metal portion of the lower electrode are electrically connected with one another through a plurality of first connection vias, and the first metal portion of the upper electrode and the second metal portion of the upper electrode are electrically connected with each other through a plurality of second connection vias.

6. The capacitor array structure according to claim 1, wherein a capacitor is formed between the lower electrode and the upper electrode of each of the capacitor units, and a capacitor is formed between the first metal portion of the upper electrode of the $i^{th}$ capacitor unit and the second metal portion of the lower electrode of the $(i-1)^{th}$ capacitor unit.

7. The capacitor array structure according to claim 1, wherein the first metal portion of the upper electrode is held between the first metal portion of the lower electrode and a long linear portion of the second metal portion of the upper electrode, wherein the second metal portion of the upper electrode is disposed adjacent to a side of the third metal portion of the lower electrode, and the second metal portion of the upper electrode is disposed adjacent to a side of the fourth metal portion of the lower electrode.

8. The capacitor array structure according to claim 1, wherein the second metal portion of the upper electrode further comprises a long linear portion, a short linear portion, and a plurality of connection portions, wherein the long linear portion is perpendicular to the short linear portion, and the short linear portion and the long linear portion intersect each other at an intersection point between two ends of the long linear portion, wherein the connection portions are respectively located beside the intersection point, on the two ends of the long linear portion, and on an end of the short linear portion.

9. The capacitor array structure according to claim 1, wherein the second metal portion of the lower electrode comprises a first linear portion, a second linear portion, and a third linear portion, wherein the first linear portion and the third linear portion are arranged in parallel to each other, the first linear portion and the third linear portion are respectively connected with two ends of the second linear portion, the opening is formed between the first linear portion and the third linear portion, and the first metal portion of the upper electrode has an elongated shape and is located between the first linear portion and the third linear portion.

10. The capacitor array structure according to claim 1, wherein the $i^{th}$ capacitor unit further comprises a fourth metal layer which is disposed between the second metal layer and the third metal layer and comprises the third metal portion of the upper electrode and a fifth metal portion of the lower electrode.

11. The capacitor array structure according to claim 10, wherein a top view pattern of the third metal portion of the upper electrode is identical to a top view pattern of the first metal portion of the upper electrode, and a top view pattern of the fifth metal portion of the upper electrode is identical to a top view pattern of the second metal portion of the lower electrode.

12. The capacitor array structure according to claim 1, wherein the first metal portion of the lower electrode comprises a T-shaped portion and a U-shaped portion, and a leg portion of the T-shaped portion extends into the U-shaped portion to perpendicularly intersect a bottom portion of the U-shaped portion, and a head portion of the T-shaped portion is located in the U-shaped portion.

13. The capacitor array structure according to claim 1, wherein the upper electrode of the $i^{th}$ capacitor unit and the upper electrode of the $(i-1)^{th}$ capacitor unit have a common potential.

14. The capacitor array structure according to claim 1, further comprising a first dummy capacitor unit and a second dummy capacitor unit, wherein the first dummy capacitor unit is disposed at a side of the capacitor series and the second dummy capacitor unit is disposed at an other side of the capacitor series, such that the upper electrode of the $i^{th}$ capacitor unit of the capacitor series and the lower electrode of the first dummy capacitor unit form a capacitor, and the lower electrode of an $N^{th}$ capacitor unit of the capacitor series and the upper electrode of the second dummy capacitor unit form a capacitor.

* * * * *